United States Patent
Fu et al.

(10) Patent No.: US 10,443,118 B2
(45) Date of Patent: Oct. 15, 2019

(54) MASK REPAIRING APPARATUS, METHOD FOR REPAIRING MASK AND EVAPORATION APPARATUS

(71) Applicant: BOE TECHNOLOGY GROUP CO., LTD., Beijing (CN)

(72) Inventors: Wenyue Fu, Beijing (CN); Wei Cui, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 185 days.

(21) Appl. No.: 15/503,374

(22) PCT Filed: Jun. 6, 2016

(86) PCT No.: PCT/CN2016/084945
§ 371 (c)(1),
(2) Date: Feb. 10, 2017

(87) PCT Pub. No.: WO2017/148036
PCT Pub. Date: Sep. 8, 2017

(65) Prior Publication Data
US 2018/0148821 A1    May 31, 2018

(30) Foreign Application Priority Data
Mar. 1, 2016   (CN) .......................... 2016 1 0115452

(51) Int. Cl.
*C23C 14/04* (2006.01)
*C23C 14/24* (2006.01)
*H01L 51/00* (2006.01)

(52) U.S. Cl.
CPC ............ *C23C 14/042* (2013.01); *C23C 14/04* (2013.01); *C23C 14/24* (2013.01); *H01L 51/0011* (2013.01)

(58) Field of Classification Search
CPC ..... C23C 4/0005; C23C 14/04; C23C 14/042; C23C 14/044; C23C 16/04; C23C 16/042;
(Continued)

(56) References Cited

U.S. PATENT DOCUMENTS 5,009,922 A * 4/1991 Harano ................. C03C 17/245
                                                                    204/192.29
7,239,161 B2 * 7/2007 Iwanaga ............ B23K 26/0876
                                                                    324/750.19
(Continued)

FOREIGN PATENT DOCUMENTS

CN         1426118 A      6/2003
CN       101106052 A      1/2008
(Continued)

OTHER PUBLICATIONS

English translation of JP 08-212921 (Year: 1996).*
(Continued)

*Primary Examiner* — Aiden Lee
(74) *Attorney, Agent, or Firm* — Kinney & Lange, P.A.

(57) ABSTRACT

The present disclosure provides a mask repairing apparatus, a method for repairing a mask and an evaporation apparatus. The mask repairing apparatus includes: a repairing device configured to repair a portion of a mask to be repaired; and a moving mechanism installed within a region facing towards the mask and configured to drive the repairing device to move to a position which is opposite to the portion of the mask to be repaired.

17 Claims, 5 Drawing Sheets

(58) Field of Classification Search
CPC ....... C23C 14/24–14/325; C30B 25/04; H01L 51/0011
See application file for complete search history.

(56) References Cited

U.S. PATENT DOCUMENTS

| | | | | |
|---|---|---|---|---|
| 2001/0009222 | A1* | 7/2001 | Mizouchi | C23C 14/185 |
| | | | | 204/192.17 |
| 2002/0170822 | A1* | 11/2002 | Chang | C23C 14/35 |
| | | | | 204/298.16 |
| 2005/0005848 | A1* | 1/2005 | Yamazaki | C23C 14/12 |
| | | | | 118/719 |
| 2006/0144325 | A1* | 7/2006 | Jung | C23C 14/042 |
| | | | | 117/105 |
| 2007/0296324 | A1* | 12/2007 | Yoo | C23C 14/042 |
| | | | | 313/402 |
| 2012/0237682 | A1* | 9/2012 | Hong | C23C 14/042 |
| | | | | 427/282 |
| 2013/0133575 | A1* | 5/2013 | Gauje | G01B 7/107 |
| | | | | 118/712 |

FOREIGN PATENT DOCUMENTS

| | | | |
|---|---|---|---|
| CN | 101192007 | A | 6/2008 |
| CN | 103208455 | A | 7/2013 |
| CN | 103981491 | A | 8/2014 |
| CN | 104004995 | A | 8/2014 |
| CN | 203807547 | U | 9/2014 |
| CN | 104131251 | A | 11/2014 |
| JP | 08212921 | A * | 8/1996 |
| KR | 20110064777 | A | 6/2011 |
| TW | 201013303 | A | 4/2010 |

OTHER PUBLICATIONS

International Search Report and Written Opinion from PCT Application Serial No. PCT/CN2016/084945, dated Sep. 27, 2016, 11 pages.

First Chinese Office Action, for Chinese Patent Application No. 201610115452.3, dated Jul. 10, 2017, 9 pages.

* cited by examiner

MASK REPAIRING APPARATUS, METHOD FOR REPAIRING MASK AND EVAPORATION APPARATUS

CROSS-REFERENCE TO RELATED APPLICATION

This application is a Section 371 National Stage Application of International Application No. PCT/CN2016/084945, filed on Jun. 6, 2016, entitled "MASK REPAIRING APPARATUS, METHOD FOR REPAIRING MASK AND EVAPORATION SYSTEM", which has not yet published, which claims priority to Chinese Application No. 201610115452.3, filed on Mar. 1, 2016, incorporated herein by reference in their entirety.

BACKGROUND OF THE DISCLOSURE

Field of the Disclosure

The present disclosure relates to a technology for processing a mask, in particular, to a mask repairing apparatus, a method for repairing a mask and an evaporation apparatus.

Description of the Related Art

A fine metal mask (FMM) is mainly applied to an evaporation and deposition (i.e. vapor-deposition) of a film onto a display panel, for example, an evaporation and deposition of a color film onto an organic light-emitting diode (OLED) display panel.

Figure 1:
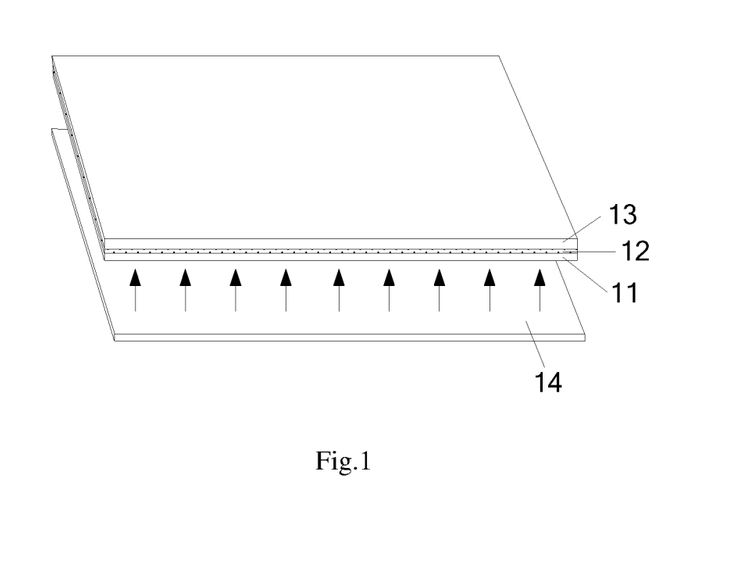
FIG. 1 is a schematic view showing a principle of a film vapor-deposition process.

FIG. 1 is a schematic view showing a principle of a film vapor-deposition process. As shown in FIG. 1, in a vacuum evaporation chamber, a vapor-deposited substrate 12 and a mask 11 are arranged to be opposite to each other. The vapor-deposited substrate 12 is placed above the mask 11, and an evaporation source 14 is placed below the mask 11. During the vacuum evaporation, the vapor-deposited substrate 12 and the mask 11 may move relative to each other. Such relative movement may lead to an offset of a film forming area, so that the formed film has a low precision. In order to solve the problem, a magnet cover 13 is placed above the vapor-deposited substrate 12, so that the magnet cover 13 may attract the mask 11 by means of magnetic force. In this way, the mask 11 and the vapor-deposited substrate 12 may be closely engaged, so that the relative movement between the vapor-deposited substrate 12 and the mask 11 during the vacuum evaporation may be prevented.

However, as the mask 11 has very thin and light metal mesh wires so as to ensure a high precision, the mask 11 may be magnetized by the magnet cover 13 in a case that the vacuum evaporation process is performed for a long time. As a result, the metal mesh wires tend to be adhered, so that patterns of the mask 11 become imprecise.

A conventional method for repairing the mask is to demagnetize the mask with a demagnetizer held by an operator. In such a method, it is necessary to take out the mask from the vacuum evaporation chamber, so that the working amount is large.

SUMMARY

Embodiments of the present disclosure provide a mask repairing apparatus, a method for repairing a mask and an evaporation apparatus. By using the mask repairing apparatus, the mask may be repaired inside a vacuum evaporation chamber.

According to an aspect of the present disclosure, it is provided a mask repairing apparatus comprising:

a repairing device configured to repair a portion of a mask to be repaired;

and a moving mechanism installed within a region facing towards the mask and configured to drive the repairing device to move to a position which is opposite to the portion of the mask to be repaired.

In the mask repairing apparatus according to an embodiment of the present disclosure, the moving mechanism drives the repairing device to move in a plane parallel to the mask.

In the mask repairing apparatus according to an embodiment of the present disclosure, the repairing device comprises:

a demagnetizer configured to generate a magnetic field for removing magnetism generated in the mask; and a current controller configured to control a strength and an alternating frequency of the magnetic field generated by the demagnetizer.

In the mask repairing apparatus according to an embodiment of the present disclosure, the mask has a substantially rectangular profile and has a first side and a second side adjacent to the first side; and a length of the demagnetizer is larger than or equal to a length of the mask along the first side of the mask; and the moving mechanism is configured to drive the repairing device to move in a direction parallel to the second side.

In the mask repairing apparatus according to an embodiment of the present disclosure, the moving mechanism comprises a first screw rod which is parallel to the second side of the mask, extends through the demagnetizer and is threadedly coupled with the demagnetizer.

In the mask repairing apparatus according to an embodiment of the present disclosure, the moving mechanism further comprises a guiding rod which is parallel to the second side of the mask and extends through the demagnetizer, and a plane in which the first screw rod and the guiding rod are located is parallel to the mask so as to guide the demagnetizer to move parallel to the mask.

The mask repairing apparatus according to an embodiment of the present disclosure further comprises:

an image capturing device configured to move within the region facing towards the mask in the plane parallel to the mask under driving of the moving mechanism so as to capture an image of the mask; and a display device configured to display the image captured by the image capturing device.

In the mask repairing apparatus according to an embodiment of the present disclosure, the image capturing device is disposed on the demagnetizer and is movable with the demagnetizer; and the moving mechanism is further configured to drive the image capturing device to move in a direction perpendicular to a moving direction of the demagnetizer.

In the mask repairing apparatus according to an embodiment of the present disclosure, the repairing device further comprises a laser configured to emit laser towards the mask; and the moving mechanism is further configured to drive the laser to move to the position which is opposite to the portion of the mask to be repaired according to the image displayed on the display device.

In the mask repairing apparatus according to an embodiment of the present disclosure, the moving mechanism is configured to drive the laser to move to a position which is directly opposite to a position on the mask where evaporated material is accumulated based on a case that the display device shows that the evaporated material has been accumulated on the mask.

The mask repairing apparatus according to an embodiment of the present disclosure further comprises a laser controller which is configured to control an intensity of laser emitted by the laser.

In the mask repairing apparatus according to an embodiment of the present disclosure, the laser is disposed on the demagnetizer and is movable with the demagnetizer; and the moving mechanism is further configured to drive the laser to move in a direction perpendicular to a moving direction of the demagnetizer.

In the mask repairing apparatus according to an embodiment of the present disclosure, the moving mechanism further comprises:

a guiding slot disposed in a surface of the demagnetizer facing towards the mask and extending in a direction perpendicular to a moving direction of the demagnetizer; and a second screw rod disposed in the guiding slot and connected to the image capturing device and/or the laser.

According to another aspect of the present disclosure, it is provided an evaporation apparatus comprising:

a vacuum evaporation chamber;

an evaporation source disposed in the evaporation chamber and configured to carry out a vapor-deposition to a mask disposed in the evaporation chamber and located above the evaporation source; and the mask repairing apparatus according to any one of the above embodiments, wherein, the repairing device of the mask repairing apparatus is located inside the evaporation chamber.

According to a further aspect of the present disclosure, it is provided a method for repairing a mask by using the mask repairing apparatus according to any one of the above embodiments, comprising:

activating the repairing device; and activating the moving mechanism so that the moving mechanism drives the repairing device to move within a region facing towards the mask.

In the method according to an embodiment of the present disclosure, in a case that the repairing device comprises a demagnetizer and a current controller, the step of activating the repairing device comprises: activating the current controller to supply an alternating current into the demagnetizer, wherein the magnitude of the alternating current supplied into the demagnetizer by the current controller is continuously changed.

In the method according to an embodiment of the present disclosure, in a case that the repairing apparatus further comprises an image capturing device and a display device, the method further comprises:

capturing an image of a portion of the mask opposite to the image capturing device and sending the image to the display device by the image capturing device; and receiving and displaying the image sent by the image capturing device by the display device.

In the method according to an embodiment of the present disclosure, in a case that the repairing device comprises a laser, the method further comprises:

activating the moving mechanism so that the moving mechanism drives the laser to move to a position which is directly opposite to a position on the mask where the evaporated material is accumulated, if the display device displays that the evaporated material has been accumulated on the mask; and activating the laser to emit laser towards the position where the accumulated evaporated material is located.

BRIEF DESCRIPTION OF THE DRAWINGS

In order to explain technical solutions in the embodiments of the present disclosure or in the prior art more clearly, the drawings required to describe the embodiments are briefly introduced below. It is apparent that the described drawings are merely a part of the embodiments of the present disclosure. Those skilled in the art may obtain other drawings based on these drawings without paying any creative efforts.

| List of reference numerals: | |
|---|---|
| 11 - mask; | 12- vapor-deposited substrate; |
| 13 - magnet cover; | 14 - evaporation source; |
| 20 - repairing device; | 21 - demagnetizer; |
| 22 - current controller; | 30 - moving mechanism; |
| 31 - first screw rod; | 32 - guiding rod; |
| 33 - guiding slot; | 34 - second screw rod; |
| 40 - image capturing device; | 100 - mask repairing apparatus; |
| 111 - first side; | 112 - second side. |

DETAINED DESCRIPTION OF PREFERRED
EMBODIMENTS OF THE DISCLOSURE

Hereinafter, technical solutions in the embodiments of the present disclosure will be clearly and completely described in conjunction with the drawings of the embodiments of the present disclosure. It is obvious that the embodiments to be described are only a part of embodiments of the present disclosure, rather than all of the embodiments. Based on the embodiments of the present disclosure, all other embodiments obtained by those skilled in the art without any creative efforts belong to the scope of the present invention.

According to a generally inventive concept of the present disclosure, it is provided a mask repairing apparatus comprising a repairing device and a moving mechanism. The repairing device is configured to repair a portion of a mask to be repaired. The moving mechanism is installed within a region facing towards the mask and configured to drive the repairing device to move to a position which is opposite to the portion of the mask to be repaired.

Figure 2:
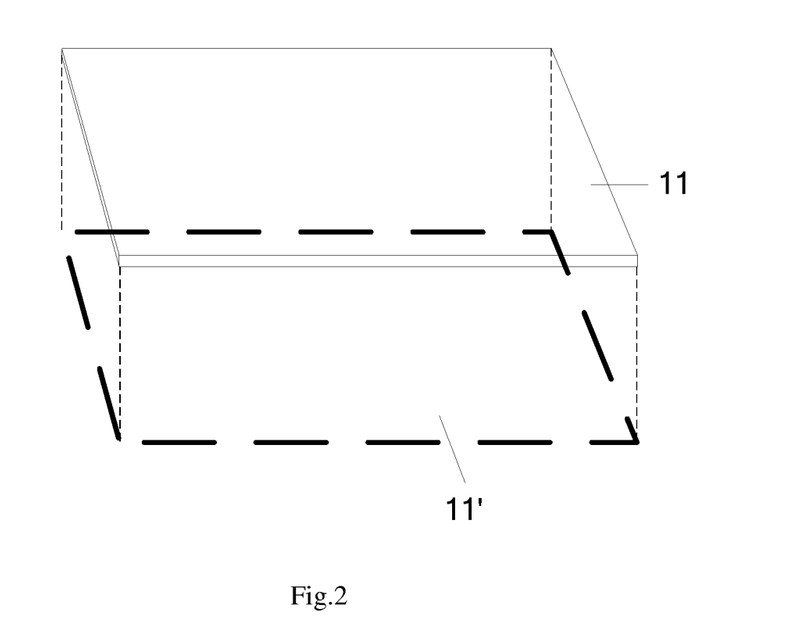
FIG. 2 is a schematic view of a mask and a region facing towards the mask according to an exemplary embodiment of the present disclosure.

As shown in FIG. 2, during a vapor deposition of a mask, a region 11' facing towards the mask denotes a region of a vertical projection of a plane in which the mask 11 is located. The region 11' facing towards the mask is located in a plane parallel to the mask and has the same area as the mask 11. In an embodiment of the present disclosure, a moving mechanism is installed in the region facing towards the mask and configured to drive a repairing device to move to a position corresponding to a portion of the mask 11 to be repaired, so as to allow the repair device to repair the portion of the mask to be repaired. For example, as shown in FIG. 2, the moving mechanism may drive the repairing device to move within the region 11' in a plane parallel to the mask 11, so that a constant distance is always kept between the repairing device and the mask, thereby carrying out a uniform repairment to defects of the mask. Optionally, the moving mechanism may be a manipulator, a mechanical robot and the like. The mask may be a metal mask.

Figure 2A:
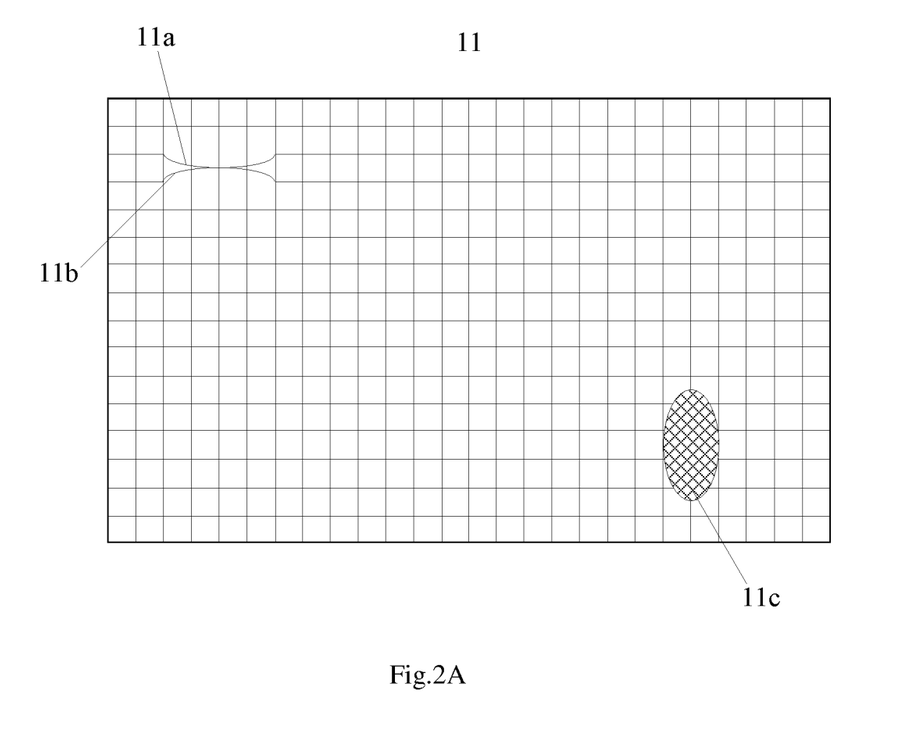
FIG. 2A is a schematic view showing defects on the mask.

Moreover, the mask may be repaired depending on actual defects of the mask. For example, if metal mesh wires are adhered due to the magnetization of the mask, as shown in FIG. 2A, the metal mesh wires 11a, 11b on the mask 11 are adhered together, the repairment of the mask may include a demagnetization repairment to the mask. If evaporated material is accumulated on the mask, as shown in FIG. 2A, there is evaporated material 11c accumulated on the mask 11, the repairment of the mask may include a removal of the accumulated evaporated material.

A mask repairing apparatus according to an embodiment of the present disclosure may comprise a repairing device configured to repair a portion (for example, portions which include the adhered metal mesh wires 11a, 11b and the accumulated evaporated material 11c shown in FIG. 2A) of a mask to be repaired; and a moving mechanism installed within the region facing towards the mask and configured to drive the repairing device to move to a position opposite to (i.e. corresponding to) the portion of the mask to be repaired. The repairing apparatus may be installed inside the vacuum evaporation chamber, so that it is unnecessary to take out the mask from the vacuum evaporation chamber, thereby reducing a repairing working amount. Alternatively, it is also allowed to take out the mask from the vacuum evaporation chamber and then repair the mask with the repairing device.

Figure 3:
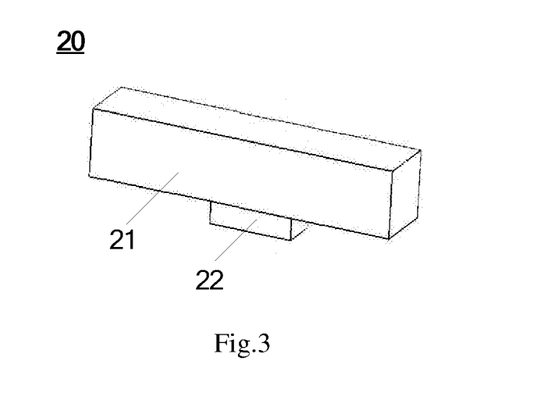
FIG. 3 is a schematic perspective view of a repairing device according to an exemplary embodiment of the present disclosure.

In an exemplary embodiment, as shown in FIG. 3, a repairing device 20 may comprise a demagnetizer 21 and a current controller 22 connected to the demagnetizer. The demagnetizer 21 is configured to generate a magnetic field for removing the magnetism generated in the mask 11. The current controller 22 is configured to control a strength and an alternating frequency of the magnetic field generated by the demagnetizer 21. As an example, a case that the current controller 22 is located below the demagnetizer 21 is described in FIG. 3, however, the positional relationship between the current controller 22 and the demagnetizer 21 is not limited to the embodiment shown in FIG. 3.

It should be noted that the demagnetizer generates alternating magnetic fields having different frequencies (i.e. alternating frequency of the magnetic field) and strength (i.e. magnitude of the magnetic field) to disorganize a magnetic domain arranged uniformly inside the mask made of metallic material, so that the adhered metal mesh wires of the mask due to the magnetization are demagnetized to be separated from each other. In general, the higher the alternating frequency of the magnetic field is and the larger the strength of the magnetic field is, the better the demagnetization effect is.

In the repairing device according to the embodiment of the present disclosure, the current controller is configured to generate alternating currents and to output alternating currents with different magnitudes and frequencies so as to drive the demagnetizer to generate alternating magnetic fields with different strengths and frequencies. In this way, the magnitude of the magnetic field may be controlled by the current controller without changing a distance between the demagnetizer and the mask. A plane in which the demagnetizer moves is parallel to a plane in which the mask is located, and a distance between the two planes is kept unchanged. In other words, by controlling the current controller to adjust the magnitude of the magnetic field generated by the demagnetizer, the mask may be demagnetized, so that a large space is not required, and it is more convenient to install the repairing apparatus inside the evaporation chamber.

Of course, it is also possible to increase the alternating frequency of the magnetic field generated by the demagnetizer by the current controller to make the demagnetization effect of the demagnetizer better, so as to save a demagnetization duration.

Figure 6:
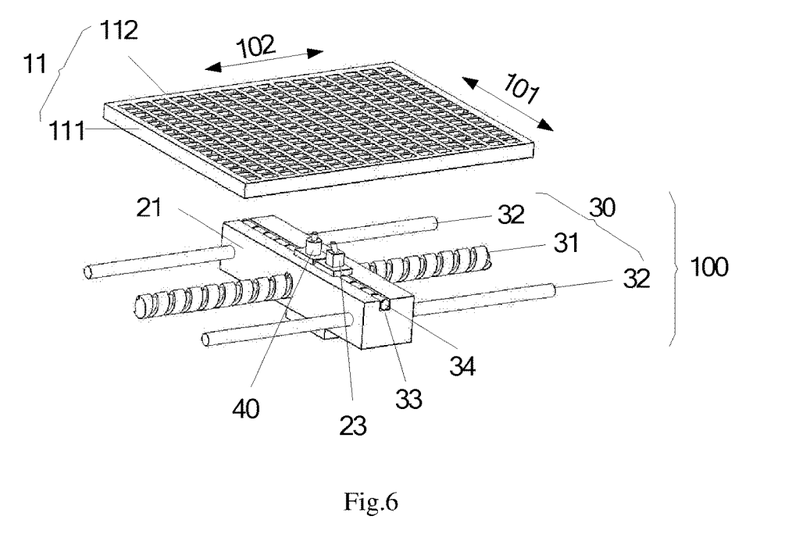
FIG. 6 is a schematic view showing a principle of repairing the mask by using the repairing apparatus shown in FIG. 5 according to an exemplary embodiment of the present disclosure.

In an embodiment, as shown in FIG. 6, the mask 11 may have a substantially rectangular profile, and have a first side 111 (e.g. a short side of the rectangle) and a second side 112 (e.g. a long side of the rectangle) adjacent to the first side. Along the first side 111 of the mask 11, a length of the demagnetizer 21 is larger than or equal to a length of the mask 11, that is, a length of the demagnetizer 21 is larger than or equal to a length of the mask 11 in a direction 101 as shown in FIG. 6. Along the second side 112 of the mask 11, a length of the demagnetizer 21 is smaller than a length of the mask 11, that is, a length of the demagnetizer 21 is smaller than a length of the mask 11 in a direction 102 as shown in FIG. 6. A moving mechanism is configured to drive the repairing device 20 to move in a direction (i.e. the direction 102 as shown in FIG. 6) parallel to the second side 112, so as to demagnetize the entire mask. In an alternative embodiment, the moving mechanism is configured to drive the repairing device 20 to move in a direction (i.e. the direction 101 as shown in FIG. 6) parallel to the first side 111, so as to demagnetize the entire mask.

Alternatively, the lengths of the demagnetizer may be smaller than the lengths of the mask along both the first side and the second side. In such a case, the demagnetizer is movable in both directions parallel to the first side and the second side respectively, so as to demagnetizer the entire mask. Alternatively, the lengths of the demagnetizer may be larger than the lengths of the mask in both directions parallel to the first side and the second side respectively.

Figure 5:
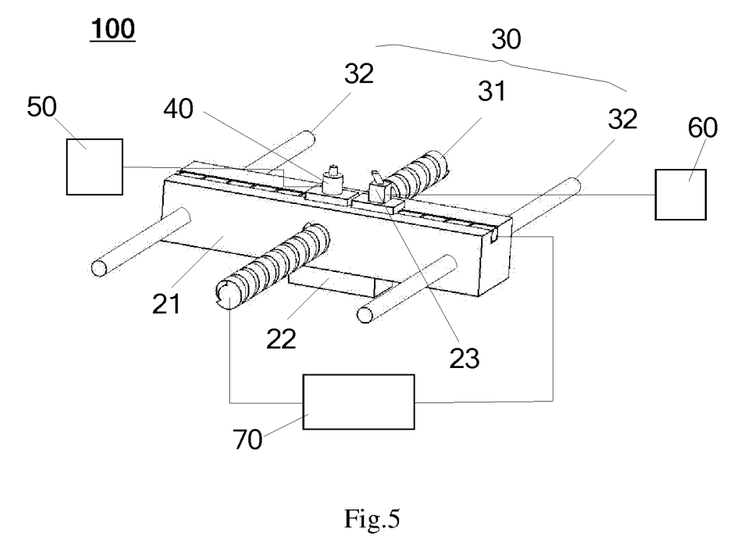
FIG. 5 is a schematic perspective view of a repairing apparatus according to an embodiment of the present disclosure.

In an embodiment, as shown in FIGS. 5 and 6, the moving mechanism 30 may comprise a first screw rod 31. The first screw rod 31 is parallel to the second side 112 of the mask 11, extends through the demagnetizer 21, and is threadedly coupled with the demagnetizer 21. In this way, the first screw rod 31 is rotated to drive the demagnetizer 21 to move in the direction parallel to the second side 112 of the mask 11, so as to repair the portion of the mask to be repaired.

In an exemplary embodiment, the moving mechanism 30 may further comprise a guiding rod 32. The guiding rod 32 is parallel to the second side 112 of the mask 11 and extends through the demagnetizer 21. A plane in which the first screw rod 31 and the guiding rod 32 are located is parallel to the mask 11, so as to direct the demagnetizer 21 to move parallel to the mask 11. The first screw rod 31 and the guiding rod 32 both extend through the demagnetizer 21, and the first screw rod 31 brings the demagnetizer 21 to move along the guiding rod 32 smoothly, then the moving direction of the demagnetizer 21 is an extending direction (i.e. the direction 102 as shown in FIG. 6) of the second side 112. Also, the plane in which the first screw rod 31 and the guiding rod 32 are located is parallel to the mask 11. As shown in FIGS. 5 and 6, as an example, the moving mechanism 30 comprises two guiding rods 32 which are located at two sides of the first screw rod 31, respectively.

In an embodiment, as shown in FIGS. 5 and 6, the repairing apparatus 100 may further comprise an image capturing device 40 and a display device 50 connected to the image capturing device 40. The image capturing device 40 is configured to move within the region facing towards the mask 11 in the plane parallel to the mask 11 under driving of the moving mechanism 30, so as to capture an image of a portion of the mask 11 opposite to the image capturing device 40 and send the image to the display device 50. The display device 50 is configured to display the image captured by the image capturing device 40.

The image capturing device 40 may capture the image of the mask and send it to the display device 50. The display device 50 may process and zoom in the image captured by the image capturing device to facilitate display. It can be determined from the image displayed on the display device whether the metal mesh wires of the mask are adhered together or not due to the magnetization. Alternatively, it can be determined from the image displayed on the display device whether the evaporated material is accumulated on the mask or not. Further, it can be determined whether it is necessary to repair the mask or not and which portion of the mask is needed to be repaired.

In an embodiment, as shown in FIGS. 5 and 6, in the case that the repairing device 20 comprises the demagnetizer 21, the image capturing device 40 is disposed on the demagnetizer 21 and is movable with the demagnetizer 21. The moving mechanism 30 is further configured to drive the image capturing device 40 to move in a direction perpendicular to the moving direction of the demagnetizer 21.

The moving direction of the demagnetizer 21 is the extending direction of the guiding rod 32. The guiding rod 32 is parallel to the second side 112, so that the moving direction of the demagnetizer 21 is an extending direction (i.e. direction 102) of the second side 112. In other words, the image capturing device 40 is movable in a direction parallel to the second side 112. The direction perpendicular to the moving direction of the demagnetizer 21 is an extending direction (i.e. direction 101) of the first side 111. The moving mechanism 30 is further configured to drive the image capturing device 40 to move in the direction perpendicular to the moving direction of the demagnetizer 21, so that the image capturing device 40 is movable in a direction parallel to the first side 111. If the image capturing device 40 has a small size, the image capturing device 40 may capture an image of the entire mask by means of the movements in the directions parallel to the first side 111 and/or the second side 112.

In an embodiment of the present disclosure, the image capturing device 40 may comprise a microscope or a CCD camera, and the display device may comprise a liquid crystal display. The image capturing device may capture an image of a portion of the mask opposite to the microscope or the CCD camera each time.

Figure 4:
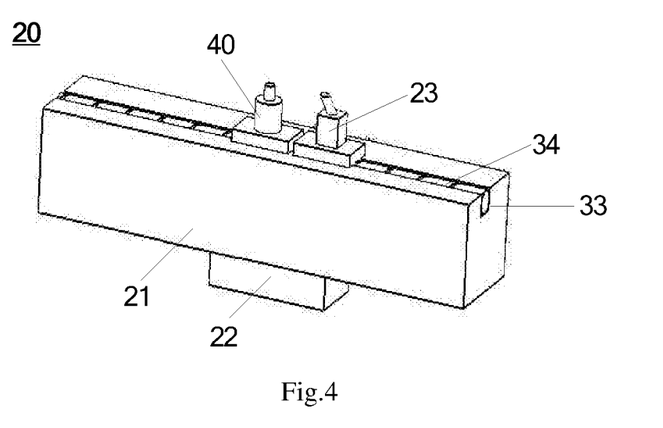
FIG. 4 is a schematic perspective view of a repairing device according to another embodiment of the present disclosure.

In an embodiment, as shown in FIGS. 4 and 6, the repairing device 20 may comprise a laser 23 configured to emit laser towards the mask 11. The moving mechanism 30 is configured to drive the laser 23 to move to a position opposite to a portion of the mask 11 to be repaired based on the image displayed on the display device. The moving mechanism 30 drives the laser 23 to move within a region parallel to the mask 11 and directly opposite the mask 11, so as to allow the laser 23 to emit laser towards any portion of the mask 11.

It should be noted that the evaporated material may be accumulated on the mask during the evaporation using the mask, thereby producing an imprecise mask pattern. In the embodiment of the present disclosure, the repairing device comprises the laser 23, and the moving mechanism is configured to drive the laser 23 to move to a position which is directly opposite to a portion of the mask on which the evaporated material is accumulated in a case that the display device displays the evaporated material has been accumulated on the mask 11. The laser 23 may emit laser towards the evaporated material accumulated on the mask so as to evaporate the accumulated evaporated material and eliminate the accumulation defect, thereby keeping the mask precision of the mask.

In an embodiment, as shown in FIGS. 4 and 6, a position of the mask irradiated by the laser emitted by the laser 23 is consistent with a position of the mask image captured by the image capturing device 40. By taking a microscope as an example of the image capturing device, a lens of the microscope is perpendicular to the mask to capture an image of a portion of the mask which is directly opposite to the lens. The laser is located at a side of the microscope, and a laser head may be inclined at an angle so that the laser emitted by the laser head is directed to the portion of the mask which is directly opposite to the lens.

In an embodiment, the repairing apparatus may further comprise a laser controller 60 configured to control an intensity of the laser emitted by the laser. As different evaporated materials have different boiling points, in the embodiment, the laser controller 60 may adjust the laser intensity to evaporate different evaporated materials.

In an embodiment, as shown in FIGS. 4 and 6, in the case that the repairing device 20 comprises the demagnetizer 21, the laser 23 is disposed on the demagnetizer 21 and is movable with the demagnetizer 21. The moving mechanism 30 is further configured to drive the laser 23 to move in the direction perpendicular to the moving direction of the demagnetizer 21. Similar to the principle of the case that the image capturing device 40 is disposed on the demagnetizer 21, the moving direction of the demagnetizer 21 is the extending direction of the guiding rod 32. The guiding rod 32 is parallel to the second side 112, so that the moving direction of the demagnetizer 21 is the direction (i.e. direction 102) parallel to the second side 112. In other words, the laser 23 is movable in the direction parallel to the second side 112. The direction perpendicular to the moving direction of the demagnetizer 21 is the extending direction (i.e. direction 101) of the first side 111. The moving mechanism 30 is further configured to drive the laser 23 to move in the direction perpendicular to the moving direction of the demagnetizer 21, so that the laser 23 is further movable in the direction parallel to the first side 111. As a result, the laser 23 is movable in both directions parallel to the first side 111 and the second side 112 so as to emit laser towards any position of the mask 11.

In an embodiment, as shown in FIGS. 5 and 6, the moving mechanism 30 may comprise a guiding slot 33 and a second screw rod 34. The guiding slot 33 is provided in a surface of the demagnetizer 21 facing towards the mask 11 and extends in a direction perpendicular to the moving direction of the demagnetizer 21. The second screw rod 34 is provided in the guiding slot 33. The second screw rod 34 is connected to the image capturing device 40 and/or the laser 23, so as to drive the image capturing device 40 and/or the laser 23 to move along the guiding slot 33. As the moving direction of the demagnetizer 21 is a direction parallel to the second side 112, and the guiding slot 33 extends in the direction perpendicular to the moving direction of the demagnetizer 21, that is, the guiding slot 33 extends in the direction parallel to the first side 111, the second screw rod 34 drives the image capturing device 40 and/or the laser 23 to move in the direction (i.e. direction 101) parallel to the first side 111.

It should be noted that the second screw rod extends through the image capturing device and is threadedly coupled with the image capturing device in a case that the moving mechanism is further configured to drive the image capturing device to move in the direction perpendicular to the moving direction of the demagnetizer. The second screw rod extends through the laser and is threadedly coupled with the laser in a case that the moving mechanism is further configured to drive the laser to move in the direction perpendicular to the moving direction of the demagnetizer. Alternatively, as shown in FIGS. 4 and 6, the second screw rod 34 extends through both the image capturing device 40 and the laser 23 and is threadedly coupled with both the image capturing device 40 and the laser 23 in a case that the moving mechanism is further configured to drive both the image capturing device and the laser to move in the direction perpendicular to the moving direction of the demagnetizer.

Moreover, an embodiment of the present disclosure may further provide a mask repairing apparatus 100 comprising a repairing device, a moving mechanism 30, an image capturing device 40 and a display device 50 connected to the image capturing device. The image capturing device 40 is configured to capture an image of a portion of the mask opposite to the image capturing device and send the image to the display device 50. The display device 50 is configured to display the image captured by the image capturing device. The repairing device comprises a laser 23. The moving mechanism 30 is configured to drive the laser 23 to move within a region which is directly opposite to the mask in a plane parallel to the mask.

During the mask evaporation, the evaporated material may be accumulated on the mask (as shown in FIG. 2A), thereby producing an imprecise mask pattern. If the display device 50 displays that the evaporated material has been accumulated on the mask, a control device 70 controls the moving mechanism 30 to drive the laser 23 to move to the position which is directly opposite to a position of the mask where the evaporated material is accumulated and controls the laser 23 to emit laser towards the position of the mask where the evaporated material is accumulated. As a result, the accumulated evaporated material is evaporated and the mask precision of the mask is kept.

The moving mechanism 30 may drive the laser to move within the region facing towards the mask in the plane parallel to the mask, so that the laser 23 may emit laser towards any position of the mask. Specific structures of the moving mechanism 30 may refer to that provided in the embodiments of the present disclosure, however, they are not limited thereto.

Figure 7:
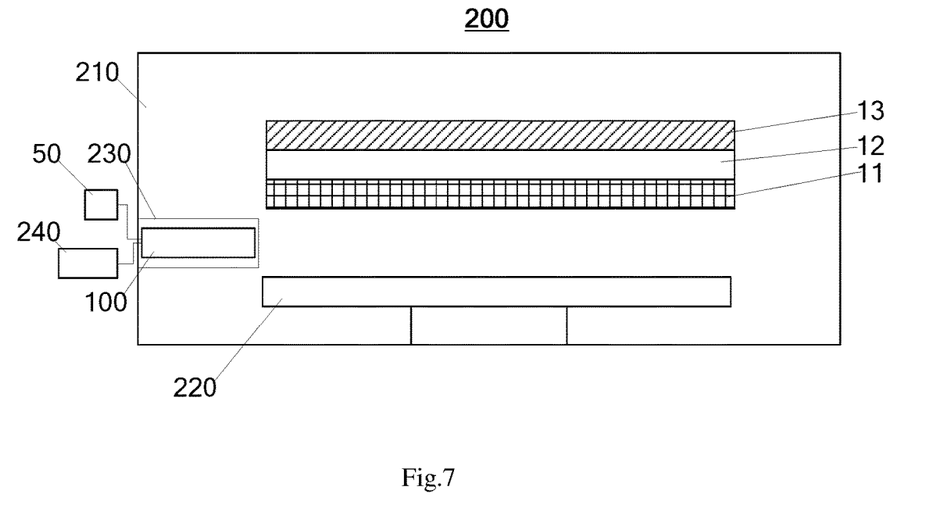
FIG. 7 is a schematic view of an evaporation apparatus according to an exemplary embodiment of the present disclosure.

According to another aspect of the present disclosure, as shown in FIG. 7, it is provided an evaporation apparatus 220 comprising: a vacuum evaporation chamber 210; an evaporation source 220 disposed in the vacuum evaporation chamber and configured to carry out a vapor-deposition to a mask 11 which is disposed in the evaporation chamber and located above the evaporation source; and the mask repairing apparatus 100 according to any one of the above embodiments, wherein the repairing device 22, 23, 24 of the mask repairing apparatus 100 is located in the evaporation chamber.

It should be noted that the mask repairing apparatus 100 may further comprise the image capturing device 40 and the display device 50 connected to the image capturing device, the image capturing device 40 is located in the evaporation chamber, and the display device 50 may be located outside the evaporation chamber to facilitate an observation of an operator.

In order to ensure a normal evaporation of the mask, the mask repairing apparatus 100 in the evaporation chamber 210 may be movable in the evaporation chamber. For example, during the evaporation using the mask, the mask repairing apparatus 100 may be located outside the region facing towards the mask. If it is required to detect and repair the mask, the mask repairing apparatus 100 is driven to move to the region facing towards the mask.

Moreover, a dust-proof cover 230 may further be provided in the evaporation chamber 210 to enclose and protect the mask repairing apparatus 100, so as to prevent the evaporated material from being deposited onto the mask repairing apparatus during the evaporation using the mask.

In an embodiment of the present disclosure, both the repairment of the mask repairing apparatus 100 and the movement of the moving mechanism 30 may be controlled by a control device 240 outside the evaporation chamber 210. In other words, an operator may control the demagnetizer 21, the laser 23 and the image capturing device 40 to move and activate by the control device 240 outside the evaporation chamber 210.

According to a further embodiment of the present disclosure, it is provided a method for repairing a mask by using the repairing apparatus 100 according to any one of the embodiments of the present disclosure, comprising:

activating a repairing device 21, 22, 23 and a moving mechanism 30 so that the moving mechanism 30 drives the repairing device 21, 22, 23 to move within a region facing towards the mask in a plane parallel to the mask 11.

In an embodiment, in a case that the repairing device comprises a demagnetizer 21 and a current controller 22, the step of activating a repairing device may comprise: activating the current controller 22 to supply an alternating current into the demagnetizer 21. The magnitude of the alternating current supplied into the demagnetizer 21 by the current controller 22 is continuously changed.

In general, the higher the alternating frequency of the magnetic field is and the higher the strength of the magnetic field is, the better the demagnetization effect is. Specifically, in the embodiment of the present disclosure, if the alternating frequency of the magnetic field is constant, the magnitude of the alternating current supplied into the demagnetizer by the current controller is gradually increased, so that the strength of the magnetic field generated by the demagnetizer is gradually increased, thereby increasing the demagnetization effect. In this way, the strength of the magnetic field generated by the demagnetizer may be controlled by the current controller without changing the distance between the demagnetizer and the mask. A plane in which the demagnetizer moves is parallel to a plane in which the mask is located, and the distance between the two planes is kept unchanged. In other words, by controlling the current controller to adjust the strength of the magnetic field generated by the demagnetizer, the mask may be demagnetized, so that a large space is not required, and it is more convenient to install the repairing apparatus in the evaporation chamber.

Further, it is also possible to increase the alternating frequency of the magnetic field generated by the demagnetizer by the current controller to improve the demagnetization effect of the demagnetizer, so as to save a demagnetization duration.

In an embodiment, in a case that the repairing apparatus 100 further comprises an image capturing device 40 and a display device 50 connected to the image capturing device, the repairing method may further comprise: capturing an image of a portion of the mask opposite to the image capturing device and sending the image to the display device 50 by the image capturing device 40; receiving and displaying the image sent by the image capturing device 40 by the display device 50.

In the embodiment of the present disclosure, the image capturing device 40 may capture the image of the mask 11 and send it to the display device 50. The display device 50 may process and zoom in the image captured by the image capturing device 40 to facilitate display. It can be determined from the image displayed on the display device whether the metal mesh wires of the mask are adhered together or not due to the magnetization. Alternatively, it can be determined from the image displayed on the display device whether the evaporated material is accumulated on the mask or not. Further, it can be determined whether it is necessary to repair the mask or not and which portion of the mask is needed to be repaired.

In an embodiment, in a case that the repairing device comprises a laser 23, if the display device displays that the evaporated material has been accumulated on the mask, the moving mechanism 30 is activated so that the moving mechanism 30 drives the laser 23 to move to a position which is directly opposite to the evaporated material accumulated on the mask, and the laser 23 is activated to emit laser towards the position where the accumulated evaporated material is located.

During the mask evaporation, the evaporated material may be accumulated on the mask, thereby producing an imprecise mask pattern. The repairing device according to the embodiment of the present disclosure comprises the laser. The laser may emit laser towards the evaporated material accumulated on the mask so that the accumulated evaporated material is evaporated and the mask precision of the mask is kept.

As an example, in the case where the image capturing device 40 is a microscope, if an area within the field of view of the microscope includes an accumulated area of the evaporated material when the microscope and the mask are in good focus, then the image captured by the microscope shows that the evaporated material has been accumulated on the mask. Thereafter, the laser 23 emits laser towards the evaporated material, and a sintering temperature of the laser is set to an evaporation temperature of the evaporated material, so that the evaporated material is evaporated. Optionally, after the sintering is completed, the observation is again performed with the microscope until there is no evaporated material on the metal mesh wires.

In an embodiment, in a case that the moving mechanism 30 comprises a first screw rod 31 and a guiding rod 32, the step of activating the moving mechanism comprises: driving the first screw rod to rotate so as to drive the repairing device to move along the guiding rod 32. In other words, the first screw rod 31 provides a driving force for the repairing device so that the repairing device moves along the guiding rod 32.

In an embodiment, in a case that the moving mechanism 30 comprises a guiding slot 33 and a second screw rod 34, the step of activating the moving mechanism further comprises: driving the second screw rod 34 to rotate so as to drive the image capturing device 40 and/or the laser 23 to move along the guiding slot 33. In a similar way, the second screw rod 34 provides a driving force for the image capturing device 40 and/or the laser 23 connected to the second screw rod so that the image capturing device 40 and/or the laser 23 connected to the second screw rod moves along the guiding slot 33.

Figure 8:
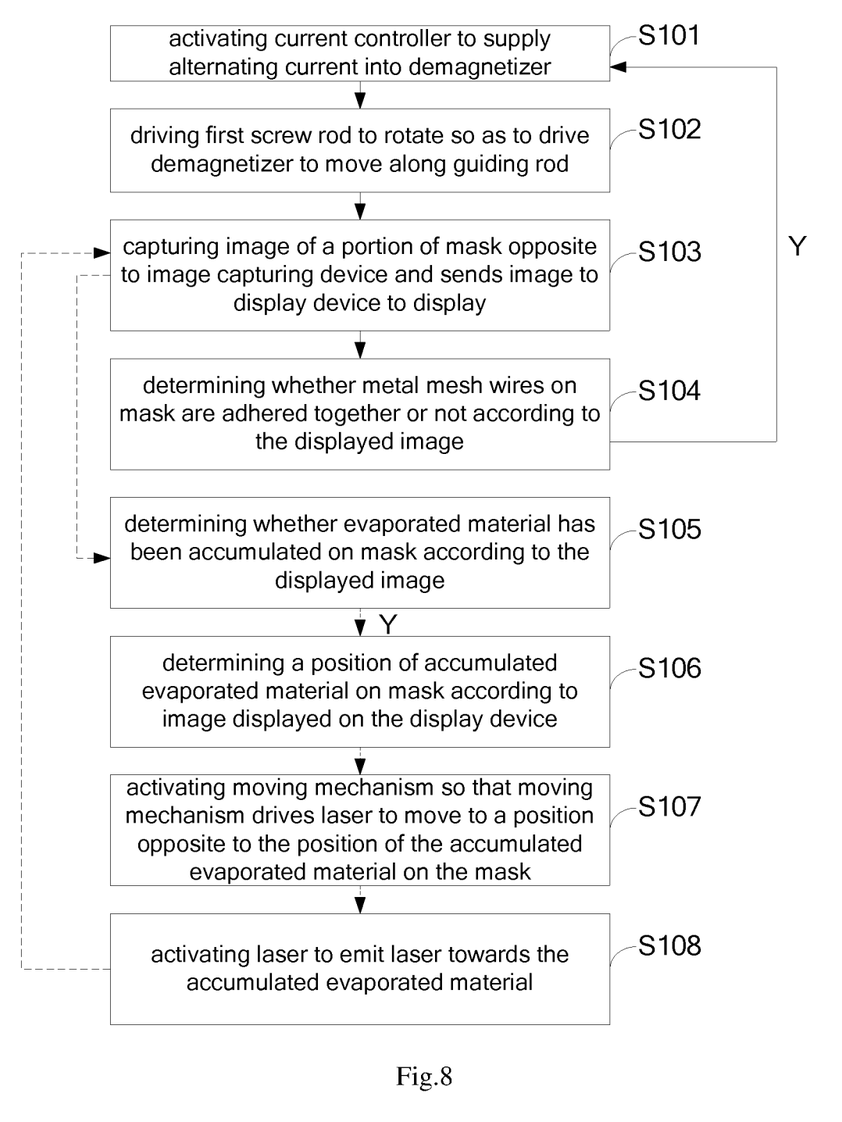
FIG. 8 is an operation flowchart of a repairing method according to an exemplary embodiment of the present disclosure.

Next, the repairing method using the repairing apparatus according to the embodiment of the present disclosure will be explained with reference to FIGS. 6, 7 and 8.

As shown in FIG. 6, the mask repairing apparatus 100 is located directly below the mask 11, and the repairing method may comprise the following steps.

In step S101, the current controller 22 is activated to supply an alternating current into the demagnetizer 21. Specifically, with a high alternating frequency of the magnetic field, a magnitude of the alternating current which is supplied into the demagnetizer 21 by the current controller 22 is gradually increased so that strength of the magnetic field generated in the demagnetizer 21 is gradually increased, so as to demagnetize the mask 11.

In step S102, the first screw rod 31 is rotated to drive the demagnetizer 21 to move along the guiding rod 32. The demagnetizer 21 moves in a direction parallel to the second side 112 so that the demagnetizer 21 may carry out an overall demagnetization on the entire mask 11.

In step S103, the image capturing device 40 captures an image of a portion of the mask 11 opposite to the image capturing device and sends the image to the display device 50 to display.

In step S104, it can be determined whether the metal mesh wires on the mask 11 are adhered together or not according to the displayed image.

If the image displayed on the display device shows that there are still adhered metal mesh wires due to the magnetization on the mask, then the steps S101 to S104 are repeated until there are no adhered metal mesh wires on the mask.

In step S105, it can be determined whether the evaporated material has been accumulated on the mask 11 according to the displayed image.

If the image displayed on the display device shows that the evaporated material has been accumulated on the mask 11, then the following steps S106 to S108 will be performed.

In step S106, a position of the accumulated evaporated material on the mask 11 may be determined according to the image displayed on the display device 40. Specifically, the position of the accumulated evaporated material on the mask 11 may be a position which is directly opposite to the image capturing device 40.

In step S107, the moving mechanism 30 is activated so that the moving mechanism drives the laser 23 to move to a position opposite to the position of the accumulated evaporated material on the mask 11.

Specifically, the first screw rod 31 and the second screw rod 34 are rotated so that the laser 23 moves to the position opposite to the position of the accumulated evaporated material on the mask 11, so as to allow the laser 23 to emit laser towards the accumulated evaporated material.

In step S108, the laser 23 is activated to emit laser towards the accumulated evaporated material, so as to evaporate the accumulated evaporated material.

The step S103 may be performed again. In step S103, the image capturing device 40 captures an image of a portion of the mask 11 opposite to the image capturing device and sends the image to the display device 50 to display.

If the image displayed on the display device shows that there is still evaporated material accumulated on the mask 11, then the above steps S106 to S108 are repeated until there is no evaporated material accumulated on the mask 11.

If the display device shows that the mask is allowed to continue to perform the mask process, that is, there is no material accumulated on the mask, then the repairing process is completed.

Of course, according to different defects of the mask to be repaired, the above steps are not limited to the above sequence, and the above description is merely to explain the embodiments of the present disclosure.

In the mask repairing apparatus, the method for repairing a mask and the evaporation apparatus according to the embodiments of the present disclosure, the driving mechanism drives the repairing device to move within the region facing towards the mask to the position opposite to the portion of the mask to be repaired, so that the repairing device may repair the portion of the mask to be repaired. The repairing apparatus may be installed inside the vacuum evaporation chamber, so that it is unnecessary to take out the mask from the vacuum evaporation chamber, thereby reducing a repairing working amount. The foregoing descriptions are merely specific embodiments of the present disclosure, but the scope of the present disclosure is not limited thereto. Any changes or substitutes which may be readily envisaged by those skilled in the art within the technical scope of the present disclosure shall fall into the scope of the present disclosure. Accordingly, the scope of the present disclosure shall be defined by the appended claims.

What is claimed is:

1. A mask repairing apparatus comprising:
a repairing device configured to repair a portion of a mask to be repaired; and
a moving mechanism installed within a region facing towards the mask and configured to drive the repairing device to move to a position which is opposite to the portion of the mask to be repaired,
wherein the repairing device comprises:
a demagnetizer configured to generate a magnetic field for removing magnetism generated in the mask; and
a laser configured to emit laser radiation towards the mask, and
wherein the laser is disposed on the demagnetizer and is movable with the demagnetizer; the moving mechanism is further configured to drive the demagnetizer to move in a plane parallel to the mask and drive the laser to move in a direction perpendicular to a moving direction of the demagnetizer.

2. The mask repairing apparatus according to claim 1, wherein, the repairing device further comprises:
a current controller configured to control a strength and an alternating frequency of the magnetic field generated by the demagnetizer.

3. The mask repairing apparatus according to claim 2, wherein, the mask has a substantially rectangular profile and has a first side and a second side adjacent to the first side; and a length of the demagnetizer is larger than or equal to a length of the mask along the first side of the mask; and
wherein, the moving mechanism is configured to drive the repairing device to move in a direction parallel to the second side.

4. The mask repairing apparatus according to claim 3, wherein, the moving mechanism comprises a first screw rod which is parallel to the second side of the mask, extends through the demagnetizer and is threadedly coupled with the demagnetizer.

5. The mask repairing apparatus according to claim 4, wherein, the moving mechanism further comprises a guiding rod which is parallel to the second side of the mask and extends through the demagnetizer, and
wherein, a plane in which the first screw rod and the guiding rod are located is parallel to the mask so as to guide the demagnetizer to move parallel to the mask.

6. The mask repairing apparatus according to claim 2, further comprising:
an image capturing device configured to move within the region facing towards the mask in a plane parallel to the mask under driving of the moving mechanism so as to capture an image of the mask; and
a display device configured to display the image captured by the image capturing device.

7. The mask repairing apparatus according to claim 6, wherein, the image capturing device is disposed on the demagnetizer and is movable with the demagnetizer; and
wherein the moving mechanism is further configured to drive the image capturing device to move in a direction perpendicular to a moving direction of the demagnetizer.

8. The mask repairing apparatus according to claim 6, wherein, the moving mechanism is further configured to drive the laser to move to the position which is opposite to the portion of the mask to be repaired according to the image displayed on the display device.

9. The mask repairing apparatus according to claim 8, wherein, the moving mechanism is configured to drive the laser to move to a position which is directly opposite to a position on the mask where evaporated material is accumulated based on a case that the display device shows that the evaporated material has been accumulated on the mask.

10. The mask repairing apparatus according to claim 8, further comprises a laser controller which is configured to control an intensity of the laser radiation emitted by the laser.

11. The mask repairing apparatus according to claim 8, wherein, the moving mechanism further comprises:
a guiding slot disposed in a surface of the demagnetizer facing towards the mask and extending in a direction perpendicular to a moving direction of the demagnetizer; and
a second screw rod disposed in the guiding slot and connected to the image capturing device and/or the laser.

12. The mask repairing apparatus according to claim 9, wherein, the moving mechanism further comprises:
a guiding slot disposed in a surface of the demagnetizer facing towards the mask and extending in a direction perpendicular to a moving direction of the demagnetizer; and
a second screw rod disposed in the guiding slot and connected to the image capturing device and/or the laser.

13. An evaporation apparatus comprising:
a vacuum evaporation chamber;
an evaporation source disposed in the evaporation chamber and configured to carry out a vapor-deposition to a mask disposed in the evaporation chamber and located above the evaporation source; and
the mask repairing apparatus according to claim 1, wherein, the repairing device of the mask repairing apparatus is located inside the evaporation chamber.

14. A method for repairing a mask by using the mask repairing apparatus according to claim 1, comprising:
activating the repairing device; and
activating the moving mechanism so that the moving mechanism drives the repairing device to move within the region facing towards the mask.

15. The method according to claim 14, wherein, the step of activating the repairing device comprises: activating a current controller to supply an alternating current into the demagnetizer,
wherein a magnitude of the alternating current supplied into the demagnetizer by the current controller is continuously changed.

16. The method according to claim 14, wherein, the method further comprises:
capturing an image of a portion of the mask opposite to an image capturing device and sending the image to a display device; and
receiving and displaying the image sent by the image capturing device.

17. The method according to claim 16, wherein, the method further comprises:
activating the moving mechanism so that the moving mechanism drives the laser to move to a position which is directly opposite to a position on the mask where the evaporated material is accumulated, when it is displayed that the evaporated material has been accumulated on the mask; and
activating the laser to emit laser radiation towards the position where the accumulated evaporated material is located.

* * * * *